United States Patent [19]
Mason et al.

[11] Patent Number: 5,194,865
[45] Date of Patent: Mar. 16, 1993

[54] ANALOG-TO-DIGITAL CONVERTER CIRCUIT HAVING AUTOMATIC RANGE CONTROL

[75] Inventors: Thomas S. Mason, Canton; Rodney D. Beaber, North Canton, both of Ohio

[73] Assignee: Interbold, North Canton, Ohio

[21] Appl. No.: 804,089

[22] Filed: Dec. 6, 1991

[51] Int. Cl.$^5$ .............................................. H03M 1/18
[52] U.S. Cl. ................................... 341/132; 341/139
[58] Field of Search ............... 341/132, 127, 139, 156; 358/174

[56] References Cited

U.S. PATENT DOCUMENTS

| | | | |
|---|---|---|---|
| 3,846,710 | 11/1974 | Chapman | 330/11 |
| 3,979,670 | 9/1976 | Vahaviolos | 324/103 |
| 4,001,604 | 1/1977 | Parks et al. | 341/132 |
| 4,016,557 | 4/1977 | Zitelli et al. | 340/347 |
| 4,517,550 | 5/1985 | Nakamura et al. | 340/347 |
| 4,642,694 | 2/1987 | Yamagishi et al. | 358/236 |
| 4,733,221 | 3/1988 | Ishii | 340/347 |
| 4,751,496 | 6/1988 | Araki et al. | 340/347 |
| 4,827,191 | 5/1989 | Chapman | 341/132 |
| 4,851,842 | 7/1989 | Iwamatsu | 341/139 |
| 4,890,107 | 12/1989 | Pearce | 341/156 |
| 5,027,117 | 6/1991 | Yoshida et al. | 341/132 |

OTHER PUBLICATIONS

National Linear Data Book, vol. 2, Rev. 1 (no date given).

Primary Examiner—A. D. Pellinen
Assistant Examiner—Brian K. Young
Attorney, Agent, or Firm—Davis Hoxie Faithfull & Hapgood

[57] ABSTRACT

An analog to digital converter circuit and technique including a peak detector circuit for generating a reference potential corresponding to a peak amplitude of the analog signal to be converted, a level shifting circuit for shifting the dc level of the analog signal in response to the reference potential, and an analog to digital converter for converting the shifted analog signal relative to the reference potential to provide automatically high bit resolution digital signals, independent of the magnitude of the input signal. Preferably, the level shifter sums one half the analog signal and one half the reference potential to produce the shifted signal, and the shifted signal is converted using a ratiometric analog to digital converter having a reference signal input of one half the reference potential. The reference potential is periodically updated by detecting a new peak. Analog signals containing amplitude modulated information may be so processed to provide effectively a dyanmic range corresponding to the input range of the analog to digital converter for optimum bit resolution.

61 Claims, 3 Drawing Sheets

ANALOG-TO-DIGITAL CONVERTER CIRCUIT HAVING AUTOMATIC RANGE CONTROL

FIELD OF THE INVENTION

This invention relates to converting analog signals to digital signals, more particularly to scaling automatically the dynamic range of the analog input signal to provide an improved digital conversion with enhanced bit resolution.

BACKGROUND OF THE INVENTION

Analog to digital converter ("ADC") devices are well known. Generally, these devices periodically sample the instantaneous analog input signal and divide it into parts over a resistor network to produce a binary representation of the instantaneous analog signal. The analog waveform is thus converted into a series of binary values, i.e., a digital signal, at the selected sampling rate. The sampling rate determines how accurately the digital signal represents the analog signal. The number of bits used in the binary representation determines the amplitude resolution of the digital signal. Practical restraints and economics limit the number of bits that may be efficiently used.

Importantly, the dynamic range of the analog signal to be converted must be adjusted to fit within the input range of the ADC. The term "dynamic range" refers to the potential difference between the positive and negative peaks of the analog signal, whether or not the signal is bi-polar. Adjusting the dynamic range conventionally involves DC level shifting the analog signal and adjusting the gain of the analog signal. However, when the dynamic range of the analog signal changes over time or in response to monitored parameters, e.g., changing signal strength, it is necessary to adjust again the new dynamic range for conversion by the ADC.

One known technique for solving this problem, as illustrated in FIG. 1 of the drawings, monitors the peak of the analog signal and adjusts the gain of the analog signal in response to the measured peak of the analog signal to a level that falls within the input range of the analog to digital converter ("ADC"). The digitized signal is then provided to a device such as a microprocessor for subsequent processing. For bi-polar analog signals that are to be converted by a unipolar ADC, the DC level of the gain adjusted analog signal may be shifted to provide a unipolar input to the ADC.

U.S. Pat. No. 4,827,191 refers to an analog to digital convertor circuit that includes an ADC having a controllable input range that is defined by a maximum span input and a minimum span input and a peak detection circuit for detecting positive and negative peaks of the analog signal. Signals representative of those detected peaks are provided to the maximum and minimum span inputs, respectively. The '191 patent also refers to using a positive peak detector and circuit for clamping the negative peaks of the analog signal and the negative span input of the ADC to ground. Accordingly, the circuit converts the analog signal relative to the maximum and minimum span inputs so as to provide an input range adjustment for a digital conversion of the entire analog signal.

It is known to use ADC devices in connection with magnetic ink character recognition techniques. Industry convention has established a font style for printing characters using magnetic ink. This convention provides that each character, when read by a suitable magnetic transducer, will produce a unique signature as an analog, pulsatile signal waveform having from four to eight peaks of one or more amplitudes.

One of the problems with analog to digital conversion in magnetic ink character recognition is that the quality of ink, and thus the intensity of the magnetic field presented to the transducer, may vary from character to character and from document to document. In addition, the mechanics of rapidly moving the transducer relative to characters printed on a document may result in spatial variations between the transducer and the ink. These variations may be caused by the transducer head lift off or force lift off, or as a result of other moving parts causing undesired vibrations, such as worn idler wheels. Consequently, the sensed analog signals have a dynamic range and magnitude that may vary from character to character and/or from document to document by as much as 25:1.

The technique illustrated in FIG. 1 may be used to adjust the gain of the analog signal for analog to digital conversion to account for such signal variations. However, this technique introduces an undesirably high count of components to adjust adequately the gain of the analog signal within the maximum and minimum limits of the ADC. These components consume valuable space in a machine and incremental amounts of power, and also provide a potential source of part failure, assembly error, and circuit instability.

The technique described in U.S. Pat. No. 4,827,191 will not overcome these problems. For one thing, the reference span inputs follow the detected peaks and thus normalize the analog signal relative to a continuously changing reference signal. This has the effect of suppressing or losing the information represented by different amplitude peaks in an analog signal waveform, and in particular, a signature waveform. Another problem with this technique is that it is apparently susceptible to interpreting noise peaks as valid signal information and normalizing the signal accordingly. This may result in erroneous digitized signals.

There is thus a continuing need for improved analog to digital converter circuits and in particular a need for such circuits for converting analog signal waveforms containing amplitude modulated information, e.g., signature waveforms representing magnetic ink characters for document processing.

SUMMARY OF THE INVENTION

It is, therefore, an object of the invention to provide an automatic dynamic range adjusting analog to digital converter for providing improved bit resolution. It is another object to provide an analog to digital converter circuit having a reduced component count by eliminating the gain adjust stage of similar prior art devices.

It is another object of the invention to provide an analog to digital converter that automatically scales an input signal to provide an optimum dynamic range for analog to digital conversion.

It is another object of the present invention to provide an improved conversion of an analog signal representative of characteristic signature waveforms to a digital signal based on a relation between the analog signal and a peak amplitude of that signal.

It is another object of the invention to provide for converting an analog signal reflecting amplitude modulated information by adjusting the dynamic range of the signal without losing the information content of the signal. It is a further object to provide the dynamic range with a maximum gain for digitization resolution and to retain information of the raw analog signal amplitude to obtain the actual sensed amplitude.

It is another object of the present invention to provide a automatic dynamic range adjusting analog to digital converter circuit for use in magnetic ink character recognition signal processing. It is another object to provide such analog to digital conversion under microprocessor control.

The present invention provides improved conversion of analog signals to digital signals such that changes in the dynamic range of the input signal automatically yield an optimum bit resolution in the resulting digitized signals. Broadly, the invention concerns apparatus and methods for monitoring an analog signal and processing the signal as a function of a detected peak amplitude of the analog signal so that the analog to digital conversion provides a high bit resolution representation of the analog signal as the dynamic range changes.

One aspect of the invention concerns an apparatus for converting an analog signal having a time varying amplitude within a dynamic range to a corresponding digital signal. One such apparatus includes:
- a peak tracker circuit for sensing the amplitude of the analog signal and providing a reference potential corresponding to the first peak amplitude of the analog signal; and
- an analog to digital converter having an analog input and a reference input and a digital output for converting the analog signal to a digital signal based on a relationship between the analog signal and the reference potential.

The peak tracker circuit is controlled to acquire a new first peak amplitude of the sensed analog signal in response to the occurrence of a preselected event and the reference potential is then frozen at the new peak amplitude so that the analog signal following each new acquired peak is converted relative to the new reference potential. If the analog signal is bi-polar and the ADC is not, then a level shifter circuit for shifting the dynamic range of the analog signal is provided such that the shifted analog signal is related to the reference potential and converted.

In a preferred embodiment, the foregoing apparatus includes a level shifter circuit for shifting the dynamic range of the analog signal in response to the reference potential, whether or not the analog signal is bipolar. More preferably, the level shifter sums one half the amplitude of the analog signal and one half the reference potential to provide the shifted analog signal.

In one embodiment, the relationship between the shifted analog signal and the reference potential in the analog to digital converter provides a full scale digital output in response to an analog input amplitude equal to the reference potential. Preferably, the relationship adjusts the dynamic range of the shifted analog signal relative to a centerpoint that is one half the reference potential such that the adjusted shifted analog signal is converted to a digital signal. A ratiometric analog to digital converter having a reference input that is one half the reference potential may be used.

The peak tracker circuit preferably includes:
- a tracking circuit having an enabled condition for providing the reference potential with an amplitude corresponding to the amplitude of the sensed analog signal and a disabled condition for maintaining the reference potential at its amplitude at the time of disablement;
- a peak detector circuit for determining when the sensed analog signal has reached a peak amplitude; and
- a first control circuit for disabling the tracking circuit in response to the detection of a peak analog signal so that the reference potential corresponds to the peak analog amplitude.

Preferably, the response time of the tracking circuit and the peak detector circuit are fast enough to permit the control circuit to disable the tracking circuit when it is reading the peak amplitude.

In a preferred embodiment, the peak tracker circuit is again enabled in response to a preselected event to acquire the next peak analog amplitude. The preselected event may be one or more of the tracking circuit being disabled for a preselected time interval, the analog to digital converter producing a full scale digital output, and the analog to digital converter producing a zero digital output.

The tracking circuit may include a sample and hold circuit. Alternately, it may include a digital up-counter producing a digital count in response to a clocking signal and a digital to analog converter for converting the digital count to an analog count signal that is the reference potential, a logic gate for enabling the up-counter to increment in response to an increasing analog signal amplitude and for disabling the up-counter from incrementing in response to the occurrence of a peak amplitude.

The foregoing apparatus, in the different embodiments, may be controlled by a suitable microprocessor and include:
- a data transceiver for transferring the digital count to the microprocessor in response to interrogation by the microprocessor;
- a first control line for enabling the analog to digital converter to digitize the adjusted, shifted analog signal at a sampling rate, for example, in response to disablement of the peak tracking circuit;
- a second control line for resetting the peak tracking circuit in response to the occurrence of the preselected event; and
- a third control line for enabling the peak tracking circuit to detect a new peak and disabling the peak tracking circuit in response to detection of a peak.

Another aspect of the invention concerns a method for converting an analog signal having a time varying amplitude in a dynamic range to a digital signal using a analog to digital converter having a digital output ranging from zero to full scale. One such method includes the steps of:
(a) sensing the amplitude of the analog signal;
(b) detecting the first peak amplitude of the sensed analog signal;
(c) providing a reference potential corresponding to the first detected peak amplitude; and
(d) converting the shifted analog signal to a digital signal based on a relationship between the shifted analog signal and the reference potential.

If appropriate, a step (e) of shifting the dynamic range of a bipolar analog signal to be suitable for a unipolar ADC may be used.

In the preferred embodiment, the step (e) is provided such that step (d) converts the shifted analog signal relative to the reference potential. More preferably, in step (e) the dynamic range of the analog signal is shifted in response to the reference potential, for example by summing one half the amplitude of the analog signal and one half the reference potential. In addition, the relationship between the shifted analog signal and the reference potential in the analog to digital converter preferably converts an analog input amplitude equal to the reference potential into a full scale digital output.

In one preferred embodiment, step (d) includes adjusting the dynamic range of the shifted analog signal relative to a centerpoint that is one half the reference potential and converting the adjusted shifted analog signal to a digital signal. A ratiometric analog to digital converter having a reference signal of one half the reference potential may be used in this method.

In a preferred embodiment, the method also includes the steps of:
(f) detecting a next peak amplitude of the sensed analog signal in response to the occurrence of a preselected event following the last detected peak amplitude;
(g) providing a new reference potential corresponding to the next detected peak amplitude;
(h) following step (d) using the new reference potential; and
(i) repeating steps f, g and h in response to each subsequent preselected event.

Steps b, c, f and g may be performed using a sample and hold circuit or a digital up-counter and a digital to analog converter for converting the digital count to an analog count signal that is the reference potential. Regarding the latter, the method may includes the steps of:
(j) incrementing the up-counter at a clocking rate in response to an increasing analog signal amplitude;
(k) disabling the up-counter from incrementing in response to the occurrence of a peak amplitude;
(l) resetting the up-counter to zero and thereafter repeating steps (j) and (k) in response to a preselected event.

The method may be practiced using a microprocessor for controlling the various operations.

Advantageously the present invention provides for automatically scaling an input signal to select an optimum dynamic range for an analog to digital converter while retaining actual amplitude information of the raw analog signal and reduces the component count of similar circuits.

BRIEF DESCRIPTION OF THE DRAWINGS

Further features of the invention, its nature and various advantages will be more apparent from the accompanying drawings and the following detailed description of the invention in which like reference numerals refer to like elements and in which.

DETAILED DESCRIPTION OF THE INVENTION

Figure 2:
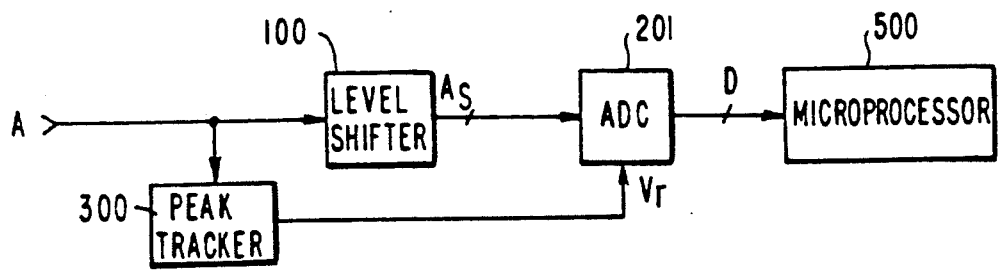
FIG. 2 is a block diagram of an analog to digital converter circuit in accordance with an embodiment of the present invention.

Referring to FIG. 2, one embodiment of the present invention provides an analog to digital converter including a peak tracker circuit 300, a level shifter circuit 100 and an analog to digital converter ("ADC") 201. Level shifter 100 is a conventional circuit that is used to adjust the dc bias of an analog input signal A to a shifted signal as to center the zero point of the input to the midrange point of ADC 201. ADC 201 is an analog to digital converter that has a dynamic input range and a reference signal input Vr. The analog input signal to be converted is thus processed as a function of reference signal Vr so that the processed signal has a dynamic range corresponding to the dynamic input range of ADC 201 and may be converted with high or full scale bit resolution.

Peak tracker circuit 300 samples the input analog signal waveform A and identifies the first amplitude peak occurring in the waveform. This amplitude peak signal is provided as reference signal Vr input to ADC 201. Thereafter, the peak tracker circuit 300 is disabled and reference signal Vr is maintained constant at the peak amplitude. The portions of the analog signal As subsequent to the peak are then further processed as a function of reference signal Vr. The resulting digital signal D is then provided to a microprocessor 500 for subsequent processing, which subsequent processing forms no part of the present invention.

In one embodiment, the further processing function may be to form a ratio of the analog signal As to the reference signal Vr. Alternatively the processing function may be some other relationship, for example, multiplying reference signal Vr by a fraction and subtracting the product from the shifted analog signal As.

The peak tracker circuit 300 is subsequently enabled to select another peak analog signal for use as the reference signal Vr in response to the occurrence of a predetermined event. Such an event may be, for example, the expiration of a predetermined time interval, or the digital output of ADC 201 being at either the minimum (or zero) output value 00 or the maximum FF. The former may occur when the analog signal amplitude falls to a selected threshold value, i.e., a negative potential or a potential that is just above the noise level or just below an amplitude selected to correspond to valid signal data. A full scale output may occur when the amplitude of the processed signal reaches the upper limit of the dynamic range of ADC 201. Suitable circuits for providing a timer circuit or for comparing the output of ADC to one or more preselected potentials for controlling the enablement of peak tracker circuit 300 are within the ability of a person of ordinary skill in the art to construct.

In operation, the circuit of FIG. 2 monitors the peak of analog signal A, identifies a peak amplitude of analog signal A, establishes a reference signal Vr corresponding to the detected peak, performs DC level shifting of the analog signal and provides a shifted signal in order to center the zero potential point of the input signal to the midrange point of the ADC, and converts the level shifted analog signal relative to the reference signal Vr in ADC 201 to digital values. On the occurrence of a predetermined event, the next occurring peak amplitude in analog signal A is sensed and the reference signal Vr is set equal to that peak amplitude. Analog to digital conversion of the analog signal then resumes using the new reference signal. Analog to digital conversion may be interrupted during the time following the occurrence of the preselected event until a new peak is detected.

It is noted that in this embodiment, for unipolar analog signals ranging from 0 volts to a peak voltage, the level shifter may be omitted such that the sensed analog signal A is to directly converted relative to reference signal Vr.

Figure 3A:
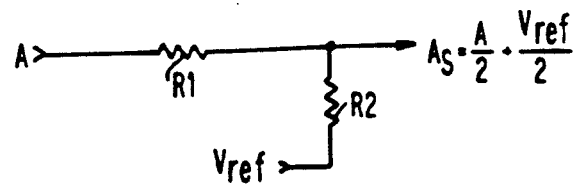
FIG. 3A is a circuit schematic of the level shifter circuit of FIG. 3.
Figure 3:
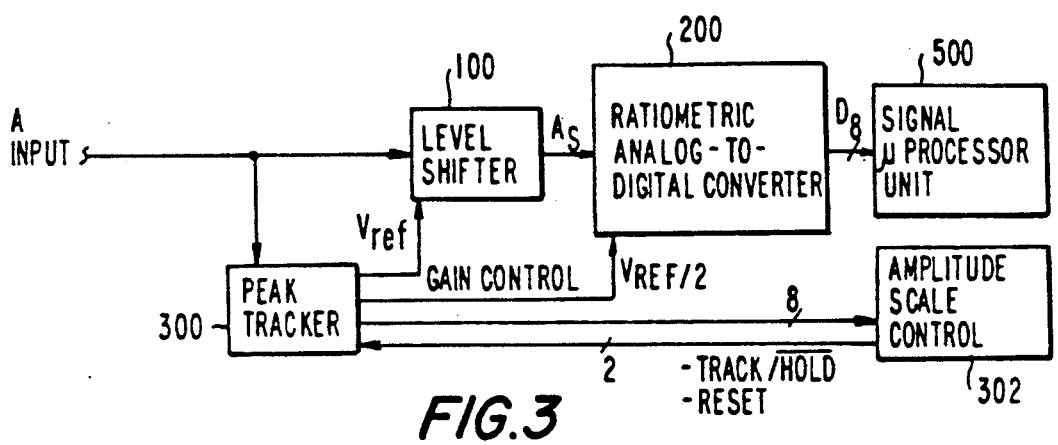
FIG. 3 is a block diagram of an analog to digital converter circuit in accordance with an alternate embodiment of the present invention.

Referring now to FIG. 3, a preferred alternate embodiment of the embodiment depicted in FIG. 2 is illustrated in which level shifter 100 is included and the analog to digital converter is a ratiometric ADC ("RADC") 200 and the reference signal provided to RADC 200 is Vref/2, corresponding to one half the peak amplitude of the first detected peak. RADC 200 provides digital conversation based on the relation between input signal As and reference signal Vref/2.

Figure 1:
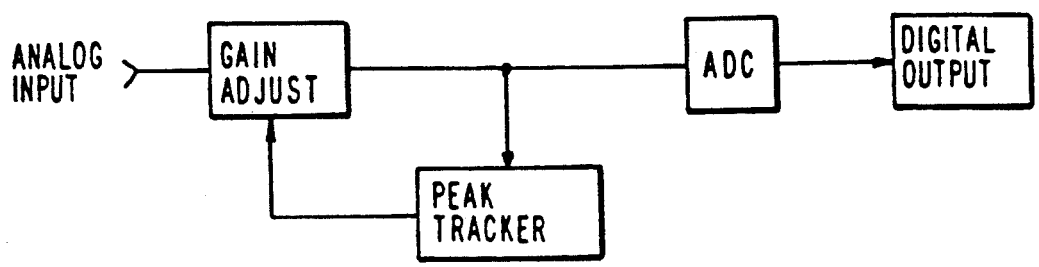
FIG. 1 is a block diagram of an analog to digital convertor in accordance with the prior art.

In this embodiment, smaller amplitude analog signals will be scaled relative to a smaller Vref/2 and larger amplitude inputs will be sealed relative to a larger Vref/2. Thus, RADC 200 assumes, along with the selection of Vref/2, the function of the gain adjust stage of prior art as depicted in FIG. 1. Consequently, analog signal A can yield full scale digital output D regardless of the amplitude of signal A, provided that the first peak amplitude detected in signal A is greater than one half the maximum amplitude of signal A occurring during the time peak tracker 300 is disabled.

In this embodiment, peak tracker circuit 300 operates in response to amplitude-scale-control circuit 302 which monitors the peak detection circuit. Peak tracker 300 may include, for example, either an analog sample and hold circuit or a digital counter and a digital to analog converter, to provide a signal representative of the amplitude of the monitored analog signal A, and identifies when a peak amplitude has been reached. In response to peak tracker 300 identifying a peak amplitude, circuit 302 disables peak tracker circuit 300 from tracking new peaks and maintains the representative signal constant while the peak tracker circuit is disabled. The representative signal is output as reference potentials Vref to level shifter 100 and Vref/2 to RADC 200. Circuit 302 also provides for enabling peak tracker circuit 300 to acquire a new peak, e.g., by discharging the sample and hold circuits or resetting a digital counter, in response to the occurrence of a preselected event. Control circuit 302 may be incorporated into a microcontroller device such as a microprocessor.

Referring to FIG. 3A, level shifter 100 uses reference signal Vref to DC shift the dynamic range of analog signal A to a range appropriate for ADC 201 or RADC 200 (collectively referred to as "ADC 200"). Level shifter 100 preferably comprises a resistor divider network having as inputs analog signal A and reference signal Vref passed across matched resistors R1 and R2, respectively. The shifted signal As is thus the sum of ½ A + ½ Vref, and is input to ADC 200. For example, for an analog signal A having a dynamic range of ± Vs with an average of 0 volts, the range is shifted to a new with a centerpoint of Vref/2, which is particularly useful for analog to digital converting circuits having a single potential supply. This is accomplished by summing ½ the input signal and one half the reference signal Vref. For another example, if the first detected peak of the analog wave form is Vs, such that peak tracker circuit 300 determines Vref is equal to Vs, then the range of outputs of ADC 200 is as set forth in the following table:

| Sensed Analog Input Signal Amplitude A | Input As To ADC | Output D From ADC (Eight bit device) |
|---|---|---|
| +2Vs | $\frac{Vref}{2} + Vs = Vref$ | FF Hex (full scale) |
| +Vs | $\frac{Vref}{2} + \frac{Vs}{2} = 3/4\ Vref$ | C0 |
| 0 | $\frac{Vref}{2} + 0 = 1/2\ Vref$ | 80 (midpoint) |
| −Vs | $\frac{Vref}{2} - \frac{Vs}{2} = 1/4\ Vref$ | 40 |
| −2Vs | $\frac{Vref}{2} - Vs = 0$ | 00 (zero) |

Advantageously, in accordance with the present invention, if the first detected peak amplitude is one half of the maximum amplitude for the dynamic range, then the complete analog dynamic range, both positive and negative, can be converted at full scale without loss of resolution. If the first detected peak is more than ½ the maximum peak amplitude, then the entire analog signal also will be converted without loss of resolution, although not at a full scale resolution. On the other hand, if the first detected peak is less than one half of the maximum amplitude then at least some of the peak amplitude signal data will be clipped by ADC 200 as it will be beyond the full scale limit. However, by selecting the predetermined event that enables peak tracker 300 to be a relatively short time interval or the occurrence of a full scale or zero digital output, and by selecting a new reference signal Vref at a clocking rate that exceeds the analog to digital conversion sampling rate, the loss of resolution can be minimized.

Accordingly, the present invention is particularly useful in for converting a series of analog signals corresponding to a series of magnetic ink characters, where the first sensed peak in any one magnetically printed character is likely to be either a maximum amplitude peak or one half the maximum amplitude peak. The invention also is particularly useful for converting time intervals of analog data containing amplitude modulated information that is acquired under similar sensing conditions such that different time intervals may be acquired under conditions yielding different amplitude signals. The term amplitude modulated signals is meant to include waveforms containing information in the relative amplitude of and spacing between pulses within the time interval.

Figure 4:
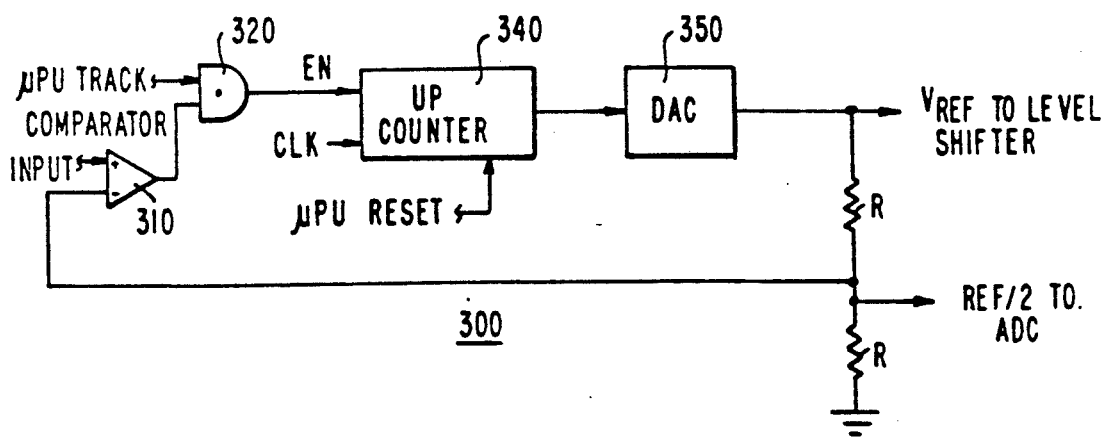
FIG. 4 is a block diagram of the peak tracker circuit of FIG. 3.
Figure 5:
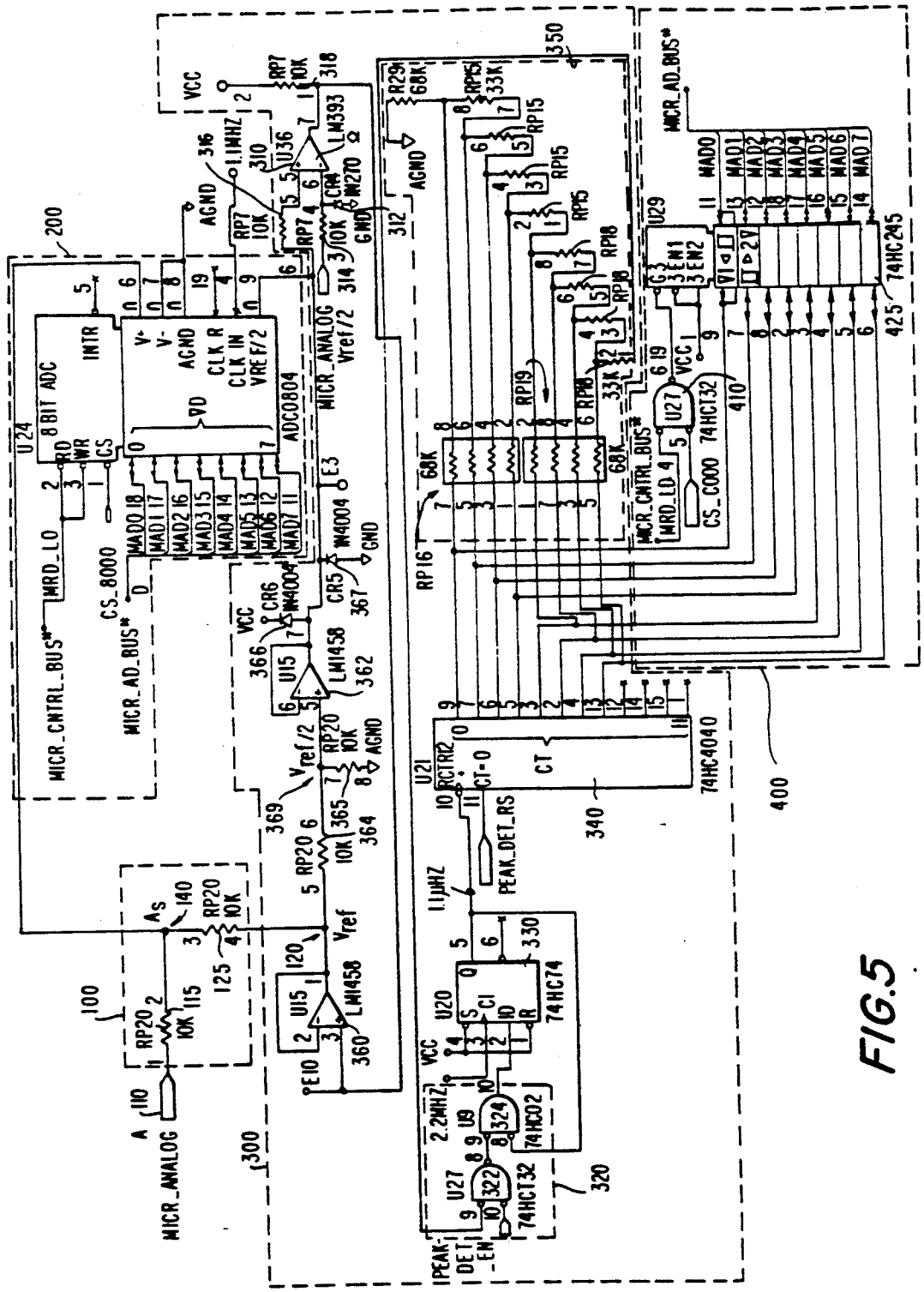
FIG. 5 is a circuit schematic diagram of another alternate embodiment of an analog to digital converter circuit in accordance with the present invention.

Referring to FIG. 4 and 5, a preferred embodiment of the apparatus of the present invention includes a level shifter circuit 100, a ratiometric analog to digital converter circuit ("RAD") 200, and a peak tracker circuit 300. As shown, the embodiment includes a data transceiver circuit 400 and a microprocessor 500.

Level shifter circuit 100 has inputs 110 and 120 for receiving the analog signal A to be converted and the reference signal Vref from peak tracker circuit 300, respectively. Level shifter circuit 100 provides at an output node 140 the shifted analog signal As that is input to ADC circuit 200 for conversion. Level shifter circuit 100 preconditions the analog signal, which may be a bipolar signal, for analog to digital conversion by converting the dynamic range potential of the analog signal to a range measurable by the ADC circuit. The input signals A and Vref are passed across resistors 115 and 125 respectively, and added at output node 140. The resistors 115 and 125 preferably are 10 K Ω resistors. The resulting output signal As is thus the sum of A/2+Vref/2. It has a dynamic potential range centered about Vref/2 and consequently provides a centerpoint that will change as the reference parameter Vref changes.

ADC circuit 200 provides for digital to analog conversion of signal As. Preferably ADC 200 comprises a ratiometric analog to digital converter ("RADC") device U24 which includes as inputs the shifted analog signal As to be converted and a reference signal potential such that the conversion of the analog signal to a digital signal is based on the relationship between the analog signal and reference potential inputs. Thus, the reference signal provides the centerpoint of the dynamic range of RADC 124 and establishes the maximum and minimum input range of RADC U24 relative to shifted signal As in response to the reference signal in the conventional manner.

Preferably, RADC U24 is an eight bit ADC device, such as model ADC 0804 manufactured by National Semiconductor Corporation, Santa Clara, Calif. In the preferred embodiment, RADC U24 is configured and operated using the pin convention provided by the manufacturer as illustrated in FIG. 5. In this regard, pins 11-18 provide to microprocessor 500 along a data bus MICR_AD_BUS the eight bit digital word output D that is converted from analog signal As input at pin 6, based on the reference signal Vref/2 input at pin 9. In this embodiment, As is level shifted to have a positive dynamic potential range and the V− input at pin 7 of RADC U24 is held at ground potential together with the ground input at pin 8. It should be understood that in an alternate embodiment signal As could be passed to the V− input at pin 7 with the V+ input at pin 6 held at ground potential, or an alternate bipolar RADC device may be used such that As is shifted to have a zero potential centerpoint.

Input clk at pin 4 receives a clock signal, preferably 1.1 MHz. In the model ADC 0804 RADC device, inputs RD at pin 2 and WR at pin 3 must be held low to sample and convert a value. Accordingly, these inputs are tied to a common node which receives signal MRD_LO from microprocessor 500. This provides a logical low signal to enable RADC U24 to sample and convert signal As to its corresponding binary value. Also, input CS at pin 1 receives signal CS_8000 from microprocessor 500, which is the chip select signal that address RADC-U24 to set the destination of the converted word.

Peak tracker circuit ("PTC") 300 provides for sampling the waveform of input signal A, latching a peak potential, and using the peak potential to set the corresponding scaling. Referring to FIGS. 4 and 5, PTC 300 includes comparator 310, logic control circuit 320, flip flop 330, counter 340 and digital to analog converter ("DAC") 350, buffer amplifiers 360 and 362 and various resistors and diodes as shown in FIG. 5 and discussed herein.

Comparator 310 is used to compare the analog signal A and the reference voltage Vref/2 and provide one logical output when the value of Vref/2 is at or greater than analog signal A and the other logical output otherwise. A suitable comparator is model LM 393 available from National Semiconductor, which is a positive peak comparator. The input signals A and Vref/2 are passed across input resistors 314 and 316 to pins 5 and 6 of comparator 310, respectively. Each input resistor 314 and 316 has a resistance of 10 K Ω. A diode 312 is used to clip off those potentials of bipolar analog signal A that are below ground potential by too much, e.g., −0.2 to −0.3 v. Such negative potentials might cause some instability in comparator 310. Diode 312 is preferable a model IN270 diode, available from Motorola, Inc., Schaumberg, Ill., with its anode held at ground potential and its cathode tied to input pin 6 of comparator 310. The output of comparator 310 at pin 7 is summed with a potential Vcc, e.g., +5 volts, passed across a 10 K Ω resistor 318 to provide the logical high output of +5 volts and the logical low output of about 0 volts in response to the appropriate logical output of comparator 310.

The output of comparator 310 is input to logic control circuit 320. Logic control circuit includes two NAND gates 322 and 324. NAND gate 322 is preferably a model 74HCT32 circuit available from Harris Semiconductor, having as an input at pin 9 the output of comparator 310 and as an input at pin 10 a peak detection enable signal PEAK_DET_EN from microprocessor 500. The output of NAND gate 322 is passed as one input to NAND gate 324. NAND gate 324 is preferably a model 74HC02 circuit available from Motorola, Inc. having as an input pin 9 the output of NAND gate 322 and as an input at pin 8 a feedback signal from the output Q of flipflop 330. The output of NAND gate 324 is passed to flipflop 330.

Flipflop 330 is preferably a model 74HC74 circuit available from Motorola, Inc. having the following inputs: at pin 3, clock signal of 2.2 MHz; at pin 2, the output from NAND gate 324. The set and reset inputs of flipflop 330 at pins 4 and 1 respectively, are commonly tied to potential VCC, e.g., +5 volts. The Q output of flipflop 330, at pin 5, is used to control incrementing counter 340 and is fed back to NAND gate 324 as described.

Counter 340 is configured as an up-counter and is used together with DAC 350 to provide the reference signal Vref corresponding to the sensed analog peak signal. In this embodiment, counter 340 is preferably a model 74HC4040 device having as an input at pin 11 a reset signal PEAK_DET_RS from microprocessor 500, and a counting input at pin 10 which is the output of flipflop 330. The output of counter 340 at pins 2-7, 9, and 13 provide an eight bit digital count that is converted by DAC 350 into an analog count signal which is Vref. DAC 350 is conventionally constructed such that the digital count is passed across respective 68 KΩ resistors and summed using a network of 32 K resistors, with the least significant bit also being tied to ground potential across a 68 KΩ resistor.

The converted analog count signal Vref is in turn fed into the noninverting input of buffer amplifier 360, the output of which is reference signal Vref. Amplifier 360 is preferably a model LM1458 amplifier, available from National Semiconductor, with its output fed back to the inverting input.

The reference signal Vref is passed as an input to level shifter 100 and also is passed across a voltage divider network including resistors 364 and 365. Resistor 365 is tied to ground potential. Each resistor is provided with a resistance of 10 KΩ and provides reference signal Vref/2 at node 369.

The reference signal Vref/2 is passed across diodes 366 and 367 and to ADC 200 and comparator 310 as previously described. Diodes 366 and 367 are provided for clamping Vref/2 signal not too far above +5 volts and not too far below ground potential. In this embodiment, diodes 366 and 367 are preferably conventional model IN4004 devices, available from Motorola. Thus, diode 366 which is connected at its cathode to voltage Vcc of +5 and at its anode to the output of amplifier 362, will clamp signal Vref/2 below about 5.5 to 5.6 volts. Similarly, diode 367 which is connected at it anode to ground potential and at its cathode to Vref/2, will clamp Vref/2 to above about −0.5 to −0.6 volts. It is noted that in this embodiment, analog signal A is anticipated to have a dynamic range of ±5 volts and peak tracker circuit 300 senses only the positive portion of that signal. In addition, it is assumed that signals less than ±0.1 volts represent noise and not valid data and thus are suppressed or filtered in a conventional manner. Accordingly, a person of ordinary skill in the art may adjust the circuit parameters for processing analog signals of other anticipated dynamic ranges.

Preferably, the response time of circuits comprising peak tracker circuit 300 have a response time that is fast enough so that control circuit 320 can disable counter 340 before the end of the next clock interval of about 1 microsecond, following detection of a peak.

Data transceiver circuit ("DTC") 40 is used to transmit digital information to microprocessor 500 under control of the microprocessor for use as a data bus strobe that provides immunity to noise. DTC circuit 400 includes a NAND gate 410 and a latch 420. NAND gate 410 is preferably a model 74HCT32 circuit and latch 420 is preferably a model 74HC245 device available from Motorola, Inc. NAND gate 410 has as inputs chip select signal CS COOO for reading the state of counter 340 and a read signal MRD LO, both from microprocessor 500. Pins 2-9 are connected to the output pins of counter 340 to acquire the digital count when enabled by microprocessor 500. The output pins 11-18 are connected to the address bus of microprocessor 500 for subsequent processing.

It is noted that in the preferred embodiment of the present invention, the absolute value of the analog signal is not significant. However, in applications of the invention which require an absolute value, the digital count of the reference signal Vref corresponding to the peak amplitude at counter 340 could be obtained by strobing DTC 400 after a peak has been acquired. This digital count may then be added to the digital output signal D that was converted relative to that peak either to construct a digital signal corresponding to the absolute analog signal A or to reconstruct analog signal A by appropriate digital to analog conversion. These are conventional processing techniques known to those of ordinary skill in the art.

Microprocessor 500 may be any microprocessor device capable of providing signals for enabling, addressing, and resetting various circuit devices. In the preferred embodiment, an eight bit microprocessor device such as a model 8031 microcontroller available from Intel, is used. It should be understood that most other microprocessors having more or less bits could be used, with any appropriate adjustment to circuit interfaces. The operational amplifiers are provided with voltage supplies of +12 volts to provide full resolution. The voltage supplies do not affect the range of signal Vref.

In the preferred embodiment, the circuit is operated under control signals provided by microprocessor 500 in stages of operation as follows. The first stage concerns identifying a peak value. The second stage concerns converting subsequent signals relative to the peak.

The analog signal A is provided to level shifter 100 and comparator 310. To begin the first stage of a cycle, counter 340 is reset to zero by signal PEAK_DET_RS. Signal MRD_LO and chip select signals CS_C000 and CS_8000 are set to turn on DTC 400 and ADC 200. In addition, signal PEAK_DET_EN is set to cooperate with the initial output of comparator 310 to enable NAND gate 322. Thus, as the analog signal A increases in amplitude, flipflop 330, which is clocked at 2.2 MHz, will divide down the clock rate by 2 and increment counter 340 at a clock rate of 1.1 MHz. This provides for cycling the count signal through the logic control circuit at the faster clock rate before the next potential count event. As a result, the signal peak can be detected before the counter is incremented again, providing for improved accuracy. It is noted that, in the present embodiment, the counter is incremented at a rate that is faster than the rise time of the analog signal by an order of magnitude. It also is noted that the clock is faster than the sampling rate for converting the analog signal to digital to minimize the loss of analog signal data during peak acquisition in the first stage.

Counter 340 will thus increment until reference signal Vref/2, derived from DAC 350, is equal to signal A. At that the comparator output disables flipflop 330. This leaves counter 340 latched with a digital count, which is converted by DAC 350 to reference signal Vref. Reference signal Vref, which is twice the amplitude of the detected peak of analog signal A, is provided to level shifter 100 for shifting the DC bias down by ½. As counter 340 counts microprocessor 500 monitors the changes in the count through DTC 400 at a clock rate of approximately 90 microseconds. When the count stops increasing, microprocessor 500 determines that a plateau corresponding to the first peak has been reached, and in response changes signal PEAK DET_EN to disable NAND gate 322. A time delay of 3 samples may be used to minimize disabling NAND gate 322 in response to false peaks.

Thereafter, the circuit operates in the second stage until the occurrence of a preselected event. In the second stages, the analog signal A is level shifted in response to the previously acquired count of the first peak. Importantly, whereas only a positive peak is sensed in the first stage and the negative peaks are clipped by diode 312, both positive and negative peaks are shifted and converted relative to the reference signals Vref and Vref/2 in the second state.

As noted, signals below a threshold value corresponding to system noise may be ignored. The sensed peak amplitude may be compared to a threshold potential, for example, corresponding to systems noise or another minimum potential for filtering out unwanted analog signal levels, so that peaks likely to correspond to valid analog signal information are relied on for conversion. This is preferably implemented in a software routine that acquires and compares the digital count to a selected threshold value. It also may be performed in a hardware circuit, for example, comparing the analog count signal to a selected potential. Consequently, enabling or disabling the tracker circuit, specifically the up-counter in response to the comparison may easily be employed when desired. Further, strobing of the analog to digital converter may be controlled by the determination of whether the peak is a valid peak for processing so that invalid digital data is not processed.

Although ADC 200 is enabled during the first and second stages, it typically is not strobed by microprocessor 500 to acquire digitized signals at the clocking rate of 2.2 or 1.1 MHz. Rather, a slower strobe or sampling rate is used to acquire the desired resolution of the analog to digital conversion. Preferably, digital signals are obtained only at the end of the first stage and throughout the second stage at 90 microsecond intervals. The strobe rate could be increased or decreased as appropriate for the rise and fall time of the analog signal to be converted. The period of time during which the circuit operates in the second stage is selected in response to the nature of the analog signals being monitored. For example, if the invention is used in the context of reading data magnetic format, specifically alphanumeric characters written in magnetic ink as are printed on bank checks, it may be assumed that the first detected analog peak signal will be greater than one half the maximum amplitude for that character. Thus, the preselected event which enables PTC 300, and thus changes the circuit from the second stage to the first stage may be a time interval selected to correspond to the time it takes to read one character. Other time intervals may be used, for example, the time to read a prescribed number of characters or one document.

Accordingly, the present invention, when configured to sense the first peak of each character and normalize the waveform signature of that character to the first peak, overcomes the aforementioned problems of signal variation from document to document, character to character, or transducer to document spacing. It thus provides for improved bit resolution in converting each signature waveform as a character is read and converted to a digital signal for subsequent processing, e.g., identifying bank account or dollar amounts information printed on a document.

In this embodiment, the selected time interval may be selected as a function of the speed at which characters are read. For example, if characters are read at 120 characters per second, corresponding to a document having eight characters per inch traversing a magnetic character reader at 16 inches per second, the period of time corresponding to one character is 8.33 msec per character. In such an embodiment, ADC 200 may be strobed to acquire digital signals corresponding to the analog signal A at a resolution of 80 samples per character or about every 90 microseconds. The time period could be increased or reduced as the velocity of the character changes.

Alternatively, the predetermined event may be selected as a function of sensing a minimum amplitude, either analog input or digital output, as may occur, for example, in response to a space between characters.

In an alternate embodiment, the predetermined event may be selected as a function of the either sensed analog signal or the converted digital output signal approaching the maximum or minimum limit of ADC 200 based on the last acquired peak reference signal Vref. In other words, when the analog to digital converter device is or is about to be pegged at either the zero or full scale end of its range, e.g., a 00 or an FF output, then PTC 300 may be enabled to acquire a new peak and associated reference signal Vref, whereupon the analog signal is subsequently converted relative to the newly acquired signal Vref.

In yet another embodiment, the period of time may be a selected time interval of, e.g., every 25 to 100 microseconds, or any other time interval up to several seconds, selected to be appropriate for the anticipated rate of change in the dynamic range of the analog signal. The latter embodiment could be improved by combining the preselected time interval with the loss of resolution when ADC 200 goes to an output at either end of its full scale range. In this embodiment, the periodic adjustment of signal Vref will likely reduce the frequency of pegging the ADC and thus improve resolution.

Although the present invention has been disclosed in the context of converting analog signals derived from documents bearing characters printed in magnetic ink, it should be understood that the invention has broader applications for converting analog signals to digital signals. For example, a test instrument incorporating the present invention could be used to measure and display an analog signal on conventional digital display device. The display could be updated periodically, e.g., every 50-100 msec by acquiring and displaying a new reference voltage Vref, and optionally, by monitoring when the ADC pegs at 00 or FF, and acquiring and displaying a new signal Vref at that time. This would provide for a running display of the analog signal in almost real time. Other uses include the acquisition of amplitude or pulsatile analog signal information, e.g., in medical devices for detecting electrical heart activity, blood flow by optical sensors, and regeneration of transmitted data signals carrying amplitude modulated information.

Unless otherwise stated, the pin conventions used are those provided by the manufacture of the identified device. Preparation of suitable software for controlling a microprocessor to operate the described circuit elements in accordance with the present invention is believed to be well within the ability of a person of ordinary skill in the art. It also should be understood that the invention could be implemented without a microprocessor using suitable and conventional analog and/or digital circuit devices. For example, in the peak tracker circuit, an analog sample and hold device could be used in place of the digital up-counter and digital to analog converter described in connection with FIG. 5. The latter approach simplifies reading of the data by the microprocessor for subsequent processing.

One skilled in the art will appreciate that the present invention can be practiced by other than the described embodiments which are presented for purposes of illustration and not of limitation.

We claim:

1. An apparatus for converting a sensed analog signal having a time varying amplitude within a dynamic range to a corresponding digital signal, comprising:

a peak tracker circuit for monitoring the sensed analog signal and providing a reference potential with an amplitude corresponding to a sensed peak amplitude of the sensed analog signal;

an analog to digital converter having an analog signal input and a reference input for receiving a signal corresponding to the reference potential and a digital output for converting the analog signal to a digital signal based on a relationship between the analog signal and the reference input signal; and a control circuit, responsive to the occurrence of a preselected event, for causing the peak tracker circuit to provide the reference potential with an amplitude corresponding to a sensed first peak amplitude of the sensed analog signal, the sensed first peak amplitude being the peak amplitude sensed first in time following each preselected event so that the analog to digital converter converts the input analog signals sensed following each sensed first peak amplitude relative to the provided reference potential corresponding to the said sensed first peak amplitude.

2. The apparatus of claim 1 further comprising a level shifter circuit having an input for receiving the sensed analog signal and an output for providing a shifted analog signal, the shifted analog signal having the dynamic range of the sensed analog signal shifted in response to the reference potential, wherein the shifted analog signal is the analog signal input to the analog to digital converter.

3. The apparatus of claim 2 wherein the level shifter circuit sums one half the amplitude of the sensed analog signal and one half of the reference potential to provide the shifted analog signal.

4. The apparatus of claim 1 wherein, in the analog to digital converter, the relationship between the sensed analog signal and the reference potential provides a full scale digital output in response to an analog input amplitudes equal to the reference potential.

5. The apparatus of claim 4 further comprising means for determining the amplitude of the sensed analog signal in response to the reference potential and the digital output signal related to said reference potential.

6. The apparatus of claim 4 further comprising a second control circuit for causing the peak tracker circuit to ignore a sensed peak amplitude that is below a selected threshold potential.

7. The apparatus of claim 4 wherein the analog to digital converter and the relationship between the analog input and reference input signals further comprise a circuit for adjusting the dynamic range of the sensed analog signal relative to a centerpoint that is one half the reference potential such that the adjusted analog signal is converted to a digital signal.

8. The apparatus of claim 4 wherein the analog to digital converter comprises a ratiometric analog to digital converter and the reference signal input is one half the reference potential.

9. The apparatus of claim 1, wherein the peak tracker circuit further comprises:
   a tracking circuit having an enabled condition for providing the reference potential with an amplitude corresponding to the amplitude of the sensed analog signal an a disabled condition for maintaining the reference potential at its amplitude at the time of disablement; and
   a peak detector circuit for determining when the sensed analog signal has reached a peak amplitude;
   wherein the control circuit disables the tracking circuit in response to the detection of a peak analog signal so that the reference potential corresponds to the peak analog amplitude, and enables the tracking circuit in response to each preselected event.

10. The apparatus of claim 9 wherein the preselected event is selected from among the group consisting of the tracking circuit being disabled for a preselected time interval, the analog to digital converter producing a digital output at full scale, and the analog to digital converter producing a digital output of zero.

11. The apparatus of claim 9 wherein the tracking circuit further comprises a sample and hold circuit.

12. The apparatus of claim 9 wherein the tracking circuit further comprises a digital up-counter producing a digital count in response to a clocking signal and a digital to analog converter for converting the digital count to an analog count signal that is the reference potential, and wherein the control circuit enables the up-counter to increment in response to an increasing analog signal amplitude and disables the up-counter from incrementing in response to the occurrence of a peak amplitude.

13. The apparatus of claim 12 wherein the control circuit is responsive to a first input for disabling the up-counter in response to the occurrence of a peak amplitude and a second input for disabling the up-counter, subsequent to the first peak amplitude and to a third input for resetting and enabling the up-counter in response to each occurrence of the preselected event following each sensed first peak amplitude.

14. The apparatus of claim 13 wherein the preselected event is selected from among the group consisting of the up-counter being disabled for a preselected time interval, the analog to digital converter producing a digital output at full scale, and the analog to digital converter producing a digital output of zero.

15. The apparatus of claim 12 wherein the peak tracker circuit further comprises:
   a first circuit for providing the analog count signal as the reference potential,
   a second circuit for providing one half the analog count signal as the reference signal input to the analog to digital converter; and
   a level shifter circuit for summing one half the amplitude of the sensed analog signal and one half of the reference potential and providing the sum to the analog signal input.

16. The apparatus of claim 15 wherein the peak detector circuit further comprises a comparator for comparing the sensed analog signal and one half the analog count signal and determining that a peak has occurred when the analog signal amplitude falls below one half the analog count signal.

17. The apparatus of claim 13, further comprising:
   a microprocessor for controlling the tracking circuit in response to detection of a preselected event and for controlling the analog to digital converter for converting the sensed analog signal to the digital signal;
   a data transceiver for transferring the digital count to the microprocessor;
   a first control line for enabling the analog to digital converter to digitize the adjusted, analog signal at a sampling rate in response to disablement of the up-counter;
   a second control line for resetting the up-counter in response to each occurrence of the preselected event; and
   a third control line for providing the first, second and third inputs to the control circuit.

18. The apparatus of claim 17 further comprising means for determining the amplitude of the sensed analog signal in response to the digital count when the up-counter is disabled and the digital output signal related to said digital count.

19. The apparatus of claim 17 wherein the control circuit is responsive to a fourth input for maintaining the up-counter enabled in response to the digital count being below a selected threshold.

20. The apparatus of claim 19 wherein the selected threshold corresponds to a system noise level.

21. A method for converting an analog signal having a time varying amplitude in a dynamic range to a digital signal using an analog to digital converter having a digital output ranging from zero to full scale comprising:
  (a) sensing the amplitude of the analog signal;
  (b) determining the occurrence of a preselected event;
  (c) detecting a first peak amplitude of the sensed analog signal following the occurrence of a preselected event;
  (d) providing a reference potential corresponding to the detected first peak amplitude;
  (e) converting the analog signal sensed following the occurrence of a preselected event to a digital signal based on a relationship between the analog signal and the reference potential; and
  (f) repeating steps (c), (d), and (e) in response to the occurrence of each detected preselected event.

22. The method of claim 21 further comprising the step (g) of shifting the dynamic range of the sensed analog signal in response to the reference potential wherein the step (e) further comprises converting the shifted analog signal.

23. The apparatus of claim 22 wherein step (g) comprises summing one half the amplitude of the sensed analog signal and one half of the provided reference potential.

24. The apparatus of claim 21 wherein, in step (e), the relationship between the sensed analog signal and the reference potential comprises converting a sensed analog input amplitude equal to the provided reference potential into a full scale digital output.

25. The apparatus of claim 24 further comprising determining the amplitude of the sensed analog signal in response to the provided reference potential.

26. The apparatus of claim 21 wherein step (d) further comprises determining whether a detected first peak is above a selected threshold potential and providing the reference potential corresponding to the detected first peak amplitude that is above the selected threshold.

27. The apparatus of claim 21 wherein step (e) further comprises adjusting the dynamic range of the analog signal relative to a centerpoint that is one half the provided reference potential and converting the adjusted analog signal to a digital signal.

28. The method of claim 22 in which the analog to digital converter is a ratiometric analog to digital converter having a reference input and step (d) further comprises providing a signal that is one half the provided reference potential to the reference input.

29. The apparatus of claim 22 wherein the preselected event is selected from among the group consisting of a preselected time interval following the detection of a peak amplitude, producing a full scale digital output at the analog to digital converter, and producing a zero digital output at the analog to digital converter.

30. The apparatus of claim 22 wherein steps (c) and (d) are performed using a sample and hold circuit.

31. The apparatus of claim 22 wherein steps (c) and (d) further comprise:
  (h) providing a digital up-counter having a digital count and a digital to analog converter for converting the digital count to an analog count signal that is the reference potential;
  (i) incrementing the up-counter at a clocking rate in response to an increasing analog signal amplitude;
  (j) disabling the up-counter from incrementing in response to the occurrence of a peak amplitude; and
  (k) resetting the up-counter to zero and thereafter repeating steps (i) and (j) in response to a preselected event.

32. The apparatus of claim 31 wherein the preselected event is selected from among the group consisting of a preselected time interval following disabling the up-counter, producing a full scale digital output at the analog to digital converter, and producing a zero digital output at the analog to digital converter.

33. The apparatus of claim 31 wherein step (d) further comprises:
  providing the analog count signal as the reference potential for step (g); and
  providing one half the analog count signal as the reference potential for step (e).

34. The method of claim 33 wherein step (c) further comprises comparing the sensed analog signal and one half the analog count signal and determining that a peak has occurred when the analog signal amplitude falls below one half the analog count signal.

35. The method of claim 34 wherein step (c) further comprises determining that a peak has not occurred when one of the digital count and the analog count signal are below a selected threshold corresponding to invalid analog signals.

36. The method of claim 31 further comprising:
  providing a microprocessor for controlling resetting of the up-counter and for converting the analog signal to a digital signal
  providing a data transceiver for transferring the digital count to the microprocessor;
  enabling the analog to digital converter to digitize the adjusted, shifted analog signal at a first sampling rate following the disabling of the up-counter;
  monitoring the analog count signal at a second sampling rate; and
  disabling the up-counter in response to the sensed analog count signal not incrementing for a selected time period.

37. The method of claim 36 further comprising providing a digital representation of the sensed analog signal amplitude in response to the digital count when the up-counter is disabled and the digital output of the analog to digital converter corresponds to that digital count.

38. The method of claim 1 wherein the analog to digital converter converts analog signal inputs having greater and lesser amplitude values than the reference input.

39. The method of claim 21 wherein step (a) further comprises converting analog signal inputs having greater and lesser amplitude values than the reference potential.

40. An apparatus for converting a sensed analog signal having a time varying amplitude within the dynamic range to a corresponding digital signal, comprising:
  a peak tracker circuit for monitoring the sensed analog signal and providing a reference potential with an amplitude corresponding to a sensed peak amplitude of the sensed analog signal;

a level shifter circuit having an input for receiving the sensed analog signal and an output for providing a shifted analog signal, the shifted analog signal having the dynamic range of the sensed analog signal shifted in response to the reference potential;

an analog to digital converter having an analog signal input for receiving the shifted analog signal and a reference input for receiving a signal corresponding to the reference potential and a digital output for converting the shifted analog signal to a digital signal based on a relationship between the shifted analog signal and the reference input signal; and a control circuit, responsive to the occurrence of a preselected event, for causing the peak tracker circuit to provide the reference potential with an amplitude corresponding to a sensed first peak amplitude of the sensed analog signal, the sensed first peak amplitude being the peak amplitude sensed first in time following each preselected event so that the analog to digital converter converts the shifted analog signals following each sensed first peak amplitude relative to the provided reference potential.

41. The apparatus of claim 40 wherein the level shifter circuit output is the sum of one half the amplitude of the sensed analog signal and one half of the provided reference potential.

42. The apparatus of claim 41 wherein, in the analog to digital converter, the relationship between the sensed analog signal and the reference potential provides a full scale digital output in response to an analog input amplitude equal to the reference potential.

43. The apparatus of claim 40 further comprising a second control circuit for causing the peak tracker circuit to ignore a sensed peak amplitude that is below a selected threshold potential.

44. The apparatus of claim 40 wherein the level shifter circuit shifts the dynamic range of the sensed analog signal relative to a centerpoint that is one half the provided reference potential.

45. The apparatus of claim 40 wherein the analog to digital converter comprises a ratiometric analog to digital converter and the reference signal input is one half the reference potential.

46. An apparatus for converting a sensed analog signal having a time varying amplitude within a dynamic range to a corresponding digital signal, comprising:

a peak tracker circuit for monitoring the sensed analog signal and providing a reference potential with an amplitude corresponding to a sensed peak amplitude of the sensed analog including:

a tracking circuit having an enabled condition for providing the reference potential with an amplitude corresponding to the amplitude of the sensed analog signal and a disabled condition for maintaining the reference potential at its amplitude at the time of disablement; and a peak detector circuit for determining when the sensed analog signal has reached a peak amplitude;

an analog to digital converter having an analog signal input and a reference input for receiving a signal corresponding to the reference potential and a digital output for converting the analog signal to a digital signal based on a relationship between the analog signal and the reference input signal; and a control circuit, responsive to the occurrence of a preselected event, for causing the peak tracker circuit to provide the reference potential with an amplitude corresponding to a sensed first peak amplitude of the sensed analog signal, the sensed first peak amplitude being the peak amplitude sensed first in time following each preselected event so that the analog to digital converter converts the input analog signals sensed following each sensed first peak amplitude relative to the provided reference potential corresponding to said sensed first peak amplitude;

wherein the control circuit disables the tracking circuit in response to the detection of a peak analog signal so that the reference potential corresponds to the peak analog amplitude, and enables the tracking circuit in response to each preselected event.

47. The apparatus of claim 46 wherein the preselected event is selected from among the group consisting of the tracking circuit being disabled for a preselected time interval, the analog to digital converter producing a digital output at full scale, and the analog to digital converter producing a digital output of zero.

48. The apparatus of claim 46 wherein the tracking circuit further comprises a sample and hold circuit.

49. The apparatus of claim 46 wherein the tracking circuit further comprises a digital up-counter producing a digital count in response to a clocking signal and a digital to analog converter for converting the digital count to an analog count signal that is the reference potential, and wherein the control circuit enables the up-counter to increment in response to an increasing analog signal amplitude and disables the up-counter from incrementing in response to the occurrence of a peak amplitude.

50. The apparatus of claim 46 wherein the control circuit is responsive to a first input for disabling the up-counter in response to the occurrence of a peak amplitude and a second input for disabling the up-counter subsequent to the first peak amplitude and to a third input for resetting and enabling the up-counter in response to each occurrence of the preselected event following each sensed first peak amplitude.

51. The apparatus of claim 50 wherein the preselected event is selected from among the group consisting of the up-counter being disabled for a preselected time interval, the analog to digital converter producing a digital output at full scale, and the analog to digital converter producing a digital output of zero.

52. The apparatus of claim 49 wherein the peak tracker circuit further comprises:

a first circuit for providing the analog count signal as the reference potential;

a second circuit for providing one half the analog count signal as the reference signal input to the analog to digital converter;

a level shifter circuit for summing one half the amplitude of the sensed analog signal and one half of the reference potential and providing the sum to the analog signal input.

53. The apparatus of claim 52 wherein the peak detector circuit further comprises a comparator for comparing the sensed analog signal and one half the analog count signal and determining that a peak has occurred when the analog signal amplitude falls below one half the analog count signal.

54. The apparatus of claim 50 wherein the control circuit is responsive to a fourth input for maintaining the up-counter enabled in response to the digital count being below a selected threshold.

55. A method for converting an analog signal having a time varying amplitude in a dynamic range to a digital signal using an analog to digital converter having a digital output ranging from zero to full scale comprising:
(a) sensing the amplitude of the analog signal;
(b) determining the occurrence of a preselected event;
(c) detecting a first peak amplitude of the sensed analog signal following the occurrence of a preselected event;
(d) providing a reference potential corresponding to the detected first peak amplitude;
(e) shifting the dynamic range of the sensed analog signal in response to the reference potential;
(f) converting the shifted analog signal sensed following the occurrence of a preselected event to a digital signal based on a relationship between the analog signal and the reference potential; and
(g) repeating steps (c), (d), (e), and (f) in response to each occurrence of a detected preselected event.

56. The method of claim 55 wherein step (e) comprises summing one half the amplitude of the sensed analog signal and one half of the provided reference potential.

57. The method of claim 54 wherein, in step (f) the relationship between the sensed analog signal and the reference potential comprises converting a sensed analog input amplitude equal to the provided reference potential into a full scale digital output.

58. The method of claim 55 wherein step (e) further comprises determining whether a detected first peak is above a selected threshold potential and providing the reference potential corresponding to the detected first peak amplitude that is above the selected threshold.

59. The method of claim 55 wherein step (e) further comprises shifting the dynamic range of the analog signal relative to a centerpoint that is one half the provided reference potential.

60. The method of claim 55 in which the analog to digital converter is a ratiometric analog to digital converter having a reference input and step (d) further comprises providing a signal that is one half the provided reference potential to the reference input.

61. The method of claim 55 wherein the preselected event is selected from among the group consisting of a preselected time interval following the detection of a peak amplitude, producing a full scale digital output at the analog to digital converter, and producing a zero digital output at the analog to digital converter.

* * * * *